United States Patent [19]

Kawasaki

[11] Patent Number: 5,203,030
[45] Date of Patent: Apr. 13, 1993

[54] SATELLITE TRANSMISSION CAPTURING METHOD FOR GPS RECEIVER

[75] Inventor: Kenichiro Kawasaki, Saitama, Japan

[73] Assignee: Pioneer Electronic Corporation, Tokyo, Japan

[21] Appl. No.: 648,800

[22] Filed: Jan. 31, 1991

[30] Foreign Application Priority Data

Feb. 13, 1990 [JP] Japan .................................. 2-29488

[51] Int. Cl.⁵ .............................................. H04B 1/06
[52] U.S. Cl. ................................ 455/164.2; 455/167.1; 455/260; 455/265; 455/304; 375/1; 331/4
[58] Field of Search ...................... 455/147, 148, 164.2, 455/167.1, 180.3, 182.2, 192.2, 192.3, 260, 265, 304, 164.1; 375/1, 97, 102; 331/4, 1 A, 10, 25, 22

[56] References Cited

U.S. PATENT DOCUMENTS

| | | | |
|---|---|---|---|
| 2,896,169 | 7/1959 | Howell | 455/265 |
| 3,626,426 | 12/1971 | Steinberg | 455/265 |
| 3,777,276 | 12/1973 | Klein | 331/4 |
| 4,336,616 | 6/1982 | Carson et al. | 455/265 |
| 4,374,437 | 2/1983 | Citta et al. | 455/164.2 |
| 4,476,580 | 10/1984 | Tanaka et al. | 455/164.2 |
| 4,498,191 | 2/1985 | Rogers | 455/164.2 |

FOREIGN PATENT DOCUMENTS 0297774 1/1989 European Pat. Off. .
9334108 9/1989 European Pat. Off. .
8701540 3/1987 PCT Int'l Appl. .

Primary Examiner—Reinhard J. Eisenzopf
Assistant Examiner—Andrew Faile
Attorney, Agent, or Firm—Sughrue, Mion, Zinn, Macpeak & Seas

[57] ABSTRACT

A satellite transmission capturing method for the GPS receiver whereby PLL operation is stopped until the demodulation intensity of a demodulator reaches a predetermined level. The frequency of the reproduced carrier of the demodulator is consecutively changed in increments of a frequency range wider than the PLL capture range in search for satellite transmissions. This allows the demodulation intensity to reach the predetermined level in fewer frequency changing steps than ever before. Thus the time required to capture the desired satellite transmission is reduced. Where the integral time constant of a low pass filter in the demodulator is set to a value smaller than that in effect during PLL operation until the demodulation intensity of the demodulator reaches the predetermined level, a wide band demodulation intensity curve is used in search for satellite transmissions until that level is exceeded. This further widens the frequency range in which to search satellite transmissions, and the time required to capture the desired satellite transmission is further shortened accordingly.

3 Claims, 7 Drawing Sheets

SATELLITE TRANSMISSION CAPTURING METHOD FOR GPS RECEIVER

BACKGROUND OF THE INVENTION

1. Field of the Invention

The present invention relates to a satellite transmission capturing method for use with GPS (global positioning system) receivers.

2. Description of the Prior Art

The typical prior art GPS receiver inversely diffuses satellite transmissions using PN code format, the transmissions coming from GPS satellites and being spectrum-spread. After the inverse diffusion, the GPS receiver demodulates the received signal which was phase shift keyed (PSK) in order to obtain desired navigation data. The PSK signal is demodulated as follows: The in-phase and orthogonal components of a reference carrier are multiplied by the PSK signal. The resulting products are each fed to a low pass filter to acquire an in-phase channel signal I(t) and an orthogonal channel signal Q(t), the former being the original base band signal. This demodulation method is called synchronous detection.

As described, to demodulate a PSK signal requires the use of a reference carrier synchronized in phase with the receiving frequency of a desired satellite transmission. However, because satellite transmissions are sent out after balanced modulation, they do not contain a carrier. For this reason, the GPS receiver generally uses a PLL (phase locked loop) arrangement to reproduce a reference carrier synchronized in phase with the receiving frequency of the target satellite transmission.

Transmissions ($L_1$ wave) are sent from GPS satellites at 1575.42 MHz. Because GPS satellites are not geo-stationary but orbiting satellites and because the GPS receiver is mounted on a moving body such as a vehicle for on-the-move reception, the Doppler effect is experienced with satellite transmissions. That is, the actual frequency of satellite transmissions upon receipt on the ground varies in an unpredictable manner around the transmitting frequency of 1575.42 MHz. Thus in receiving and demodulating satellite transmissions with the GPS receiver on the ground, it is necessary to search the Doppler-shifted transmissions for the actual frequency and to have a demodulator reproduce a reference carrier synchronized in phase with that actual frequency.

FIG. 7 illustrates the operating principle of the typical prior art satellite transmission capturing method for use with GPS receivers. In FIG. 7, the horizontal axis stands for the frequency of the reproduced carrier of the demodulator, and the vertical axis denotes a demodulation intensity $I^2+Q^2$ of the demodulator. That is, the demodulation intensity, which indicates the status of satellite transmission reception, is represented by the sum of a demodulated in-phase channel signal I(t) squared and a demodulated orthogonal channel signal Q(t) squared. $f_c$ represents the receiving frequency of the actual Doppler-shifted satellite transmissions. A demodulation intensity curve M indicating the output characteristic of the demodulator forms a horizontally symmetrical, single-peak characteristic curve around the center of the receiving frequency $f_c$, as illustrated.

As shown in FIG. 7, when the frequency "f" of the reproduced carrier of the demodulator coincides with the receiving frequency $f_c$ of the satellite transmission, the demodulation intensity $I^2+Q^2$ is maximized. The prior art GPS receiver searches the satellite transmissions for the receiving frequency $f_c$ as follows: Within the range of Doppler-shifted frequency variations, the reproduced carrier frequency of the demodulator is switched one step at a time, i.e., in increments of a PLL capture range $\Delta f_n$ starting from a search start frequency $f_s$. When the receiving frequency $f_c$ of the satellite transmission falls within a given capture range $\Delta f_n$, the PLL function is synchronized in phase and locked so as to obtain the reference carrier for demodulation, the carrier being synchronized in phase with the receiving frequency $f_c$ of the satellite transmission.

One disadvantage of the above-described prior art satellite transmission capturing method is that it takes time to capture the satellite transmission because the transmissions are searched even as the frequency "f" of the reproduced carrier of the demodulator is changed in increments of the PLL capture range $\Delta f_n$.

SUMMARY OF THE INVENTION

It is therefore an object of the present invention to overcome the above and other deficiencies and disadvantages of the prior art and to provide a satellite transmission capturing method which, used with the GPS receiver, reduces the time required to capture satellite transmissions.

In achieving the foregoing and other objects of the present invention and according to one aspect thereof, there is provided a satellite transmission capturing method for GPS receivers comprising the step of reproducing a reference carrier of a demodulator by use of a PLL (phase locked loop) arrangement, the frequency of the reproduced carrier being consecutively changed within the capture range of the PLL arrangement in search for satellite transmissions; wherein the PLL operation is stopped until the demodulation intensity of the demodulator reaches a predetermined level so that the frequency of the reproduced carrier of the demodulator is consecutively changed in a frequency range wider than the capture range of the PLL arrangement in search for satellite transmissions.

According to another aspect of the invention, there is provided a satellite transmission capturing method for GPS receivers whereby the integral time constant of a low pass filter of the demodulator is switched to a value lower than that in effect during PLL operation until the demodulation intensity of the demodulator reaches the predetermined level.

FIG. 1 shows how the satellite transmission capturing method according to the invention works. As illustrated, the frequency "f" of the reproduced carrier of the demodulator is consecutively changed in increments of a frequency range $\Delta f_w$ wider than the PLL capture range $\Delta f_n$. Working as it does, the method reduces the number of frequency changing steps to be followed until the demodulation intensity reaches and exceeds a predetermined level (threshold value TH). That in turn translates into a reduced time required to capture the desired satellite transmission.

In FIG. 1, the wider the frequency range $\Delta f_w$, the fewer the number of frequency changing steps to be followed and the shorter the time it takes to capture the satellite transmission. However, the frequency range $\Delta f_w$ may not be widened arbitrarily; it must be smaller than a band width $\Delta F_1$ of the threshold value TH. The reason for this is that if the range $\Delta f_w$ is made wider than the range $\Delta F_1$, the reproduced carrier of the demodulator, when consecutively changed from one $\Delta f_w$ range to another, may skip the level range exceeding the threshold value TH of the demodulation intensity curve M. That makes it impossible to receive satellite transmissions.

As evident from the foregoing description, if the band width $\Delta F_1$ of the demodulation intensity curve M is widened, the frequency range $\Delta f_w$ may also be made wider, which further reduces the time required to capture the satellite transmission. One way to widen the band width $\Delta F_1$ of the demodulation intensity curve M is to replace the prior art curve $M_1$ with a wide band type curve $M_2$. To switch the demodulation intensity curve from $M_1$ to $M_2$ simply requires making the integral time constant of the low pass filter smaller. According to the invention, the integral time constant of the low pass filter for use with the demodulator is set to a value smaller than that in effect during PLL operation until the demodulation intensity of the demodulator reaches the predetermined level. This causes the demodulation intensity curve to be switched from $M_1$ to $M_2$, as depicted in FIG. 2. With the band width widened from $\Delta F_1$ to $\Delta F_2$, the frequency range $\Delta f_w$ can also be widened within the range of $\Delta f_2$. Thus the number of frequency changing steps to be followed is reduced, and the time required to capture the desired satellite transmission is shortened accordingly.

DESCRIPTION OF THE PREFERRED EMBODIMENT

Figure 3:
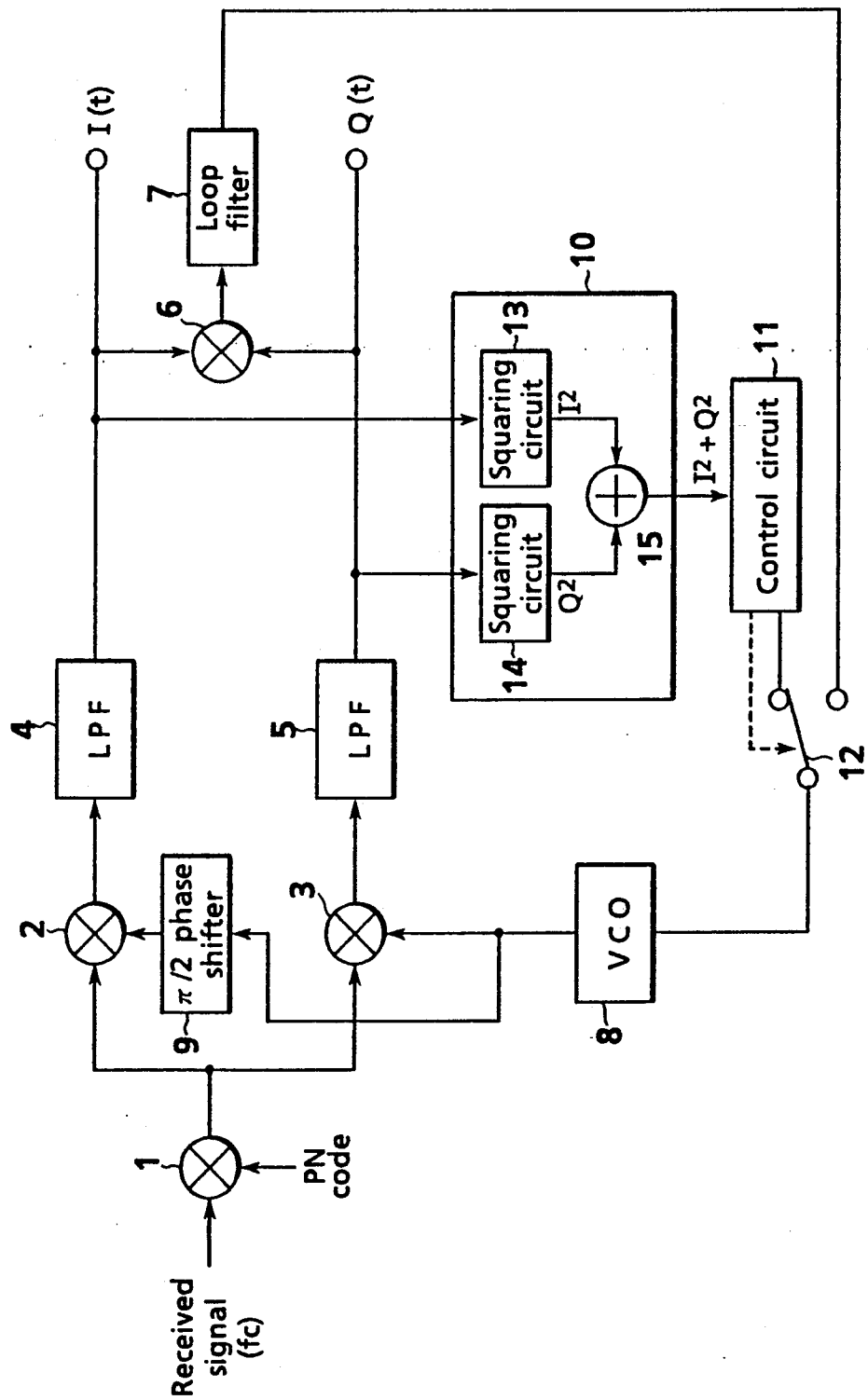
FIG. 3 is a block diagram of a first embodiment of a demodulator operating on the method according to the invention.

FIG. 3 illustrates a first embodiment of a demodulator for use with GPS receivers, the demodulator working on the satellite transmission capturing method according to the invention. This embodiment is a costas type demodulator.

In FIG. 3, reference numeral 1 is a multiplier for inverse diffusing using PN code; 2 is a multiplier for inphase channel signal demodulation; 3 is a multiplier for orthogonal channel signal demodulation; 4 is a low pass filter that suppresses the harmonic component in the product from the multiplier 2 in order to obtain an in-phase channel signal I(t); 5 is a low pass filter that suppresses the harmonic component in the product from the multiplier 3 so as to acquire an orthogonal channel signal Q(t); 6 is a multiplier for detecting the phase difference between the received carrier of satellite transmissions and a reproduced carrier; 7 is a loop filter; 8 is a voltage controlled oscillator (VCO) that outputs the reproduced carrier for demodulation; and 9 is a $\pi/2$ phase shifter for shifting by 90° the reproduced carrier from the VCO 8. These components constitute the prior art Costus type demodulator.

Figure 1:
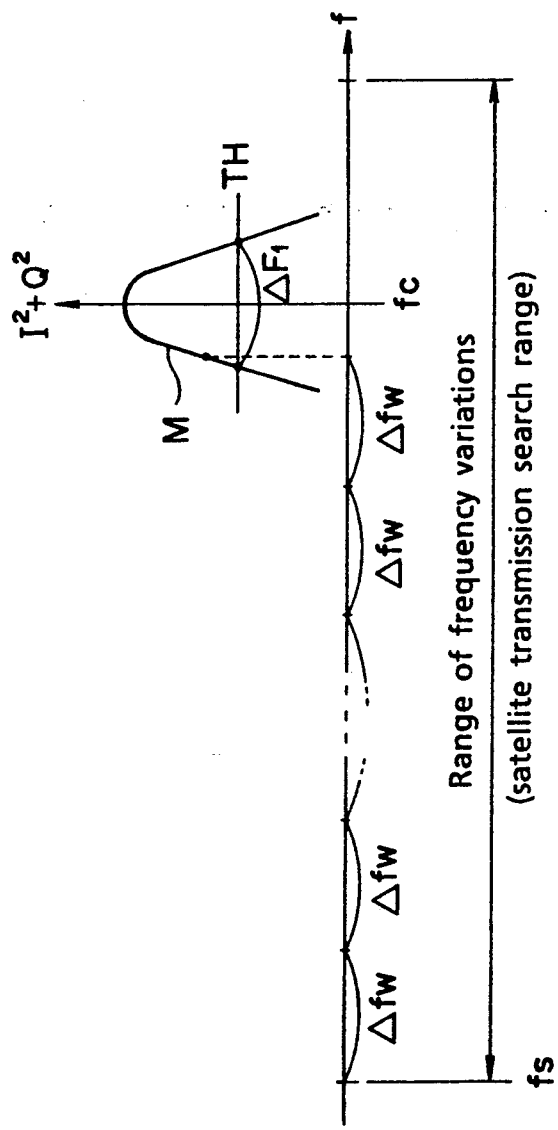
FIG. 1 is a view illustrating the operation principle of the satellite transmission capturing method according to the present invention.

The present invention is implemented by supplementing the above-described prior art demodulator with three more components: a demodulation intensity calculating circuit 10 for calculating the demodulation intensity that indicates the status of satellite transmission reception, a control circuit 11 for controlling the oscillation frequency (reproduced carrier) of the VCO 8, and a switch 12 operated by the control circuit 11. The demodulation intensity calculating circuit 10 comprises squaring circuits 13 and 14 as well as an adder 15. A demodulation intensity signal $I^2+Q^2$ is output from the output terminal of the adder 15. Plotting the demodulation intensity signal $I^2+Q^2$ for each frequency provides a horizontally symmetrical, single-peak demodulation intensity curve M around the center of the receiving frequency $f_c$ of satellite transmissions, as depicted in FIG. 1. Although the received signal of satellite transmissions admitted by the demodulator is actually an IF signal with its frequency reduced to a predetermined intermediate level, the operation involved remains the same even if the received signal is theoretically considered to be input unconverted in frequency. In fact, the latter concept makes it easier to understand the relationship between the receiving frequency $f_c$ of satellite transmissions and the carrier "f" reproduced by the VCO 8. Therefore the description that follows presupposes that the received signal of satellite transmissions unconverted in frequency is input to the demodulator.

How the above-described first embodiment works will now be described with reference to FIGS. 1, 4 and 5. In the initial state of demodulation, the switch 12 is connected to the control circuit 11.

A received signal entering the multiplier 1 is inversely diffused by use of PN code so that only the target satellite transmission is extracted. The extracted received signal (modulated signal) is input to the multipliers 2 and 3. In step S1 of FIG. 5, the control circuit 11 causes the VCO 8 to oscillate a search start frequency $f_s$ shown in FIG. 1.

Figure 5:
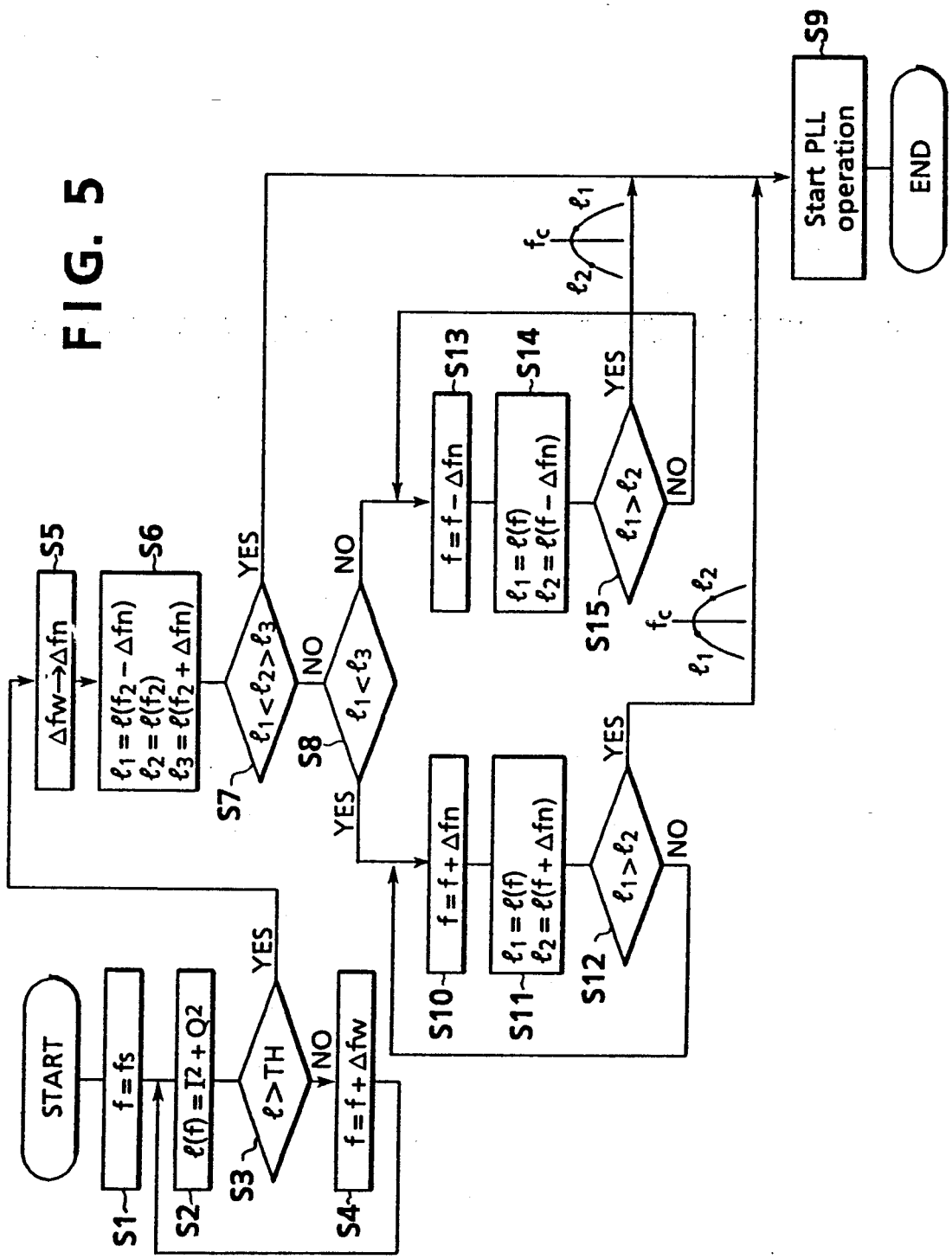
FIG. 5 is a flowchart of the steps in which the first embodiment operates.

In step S2 of FIG. 5, the following takes place: The oscillation output of the VCO 8 is supplied as is to the multiplier 3, and sent to the multiplier 2 after a 90° phase shift by the $\pi/2$ phase shifter 9, the multipliers multiplying their inputs by the modulated signal. As a result, the in-phase channel signal I(t) containing the harmonic component is output from the output terminal of the multiplier 2, and the orthogonal channel signal Q(t) also containing the harmonic component is output from the output terminal of the multiplier 3. These harmonic components in the respective channel signals are suppressed by the low pass filters 4 and 5, leaving the in-phase channel signal I(t) and orthogonal channel signal Q(t) demodulated. The demodulation intensity calculating circuit 10 causes the squaring circuits 13 and 14 to square the demodulated signals I(t) and Q(t), respectively. The adder 15 outputs a demodulation intensity signal $I(f) = (I^2+Q^2)$ to the control circuit 11.

There may be assumed a case in which the receiving frequency of the satellite transmission is located at $f_c$ of FIG. 1. In that case, the search start frequency $f_s$ is far away from the frequency $f_c$. Therefore the channel signals I(t) and Q(t) from the low pass filters 4 and 5 are each approximately zero; so is the demodulation intensity signal l(f) ($=I^2+Q^2$) output by the demodulation intensity calculating circuit 10.

In step S3 of FIG. 5, the control circuit 11 compares the demodulation intensity signal l(f), output by the demodulation intensity calculating circuit 10, with a predetermined threshold value TH to see if l(f)>TH. Until the signal l(f) exceeds the threshold value TH, as shown in FIG. 1, the oscillation frequency "f" of the VCO 8 is changed consecutively in step S4 in increments of the frequency range $\Delta f_w$ wider than the PLL capture range $\Delta f_n$.

Figure 4A:
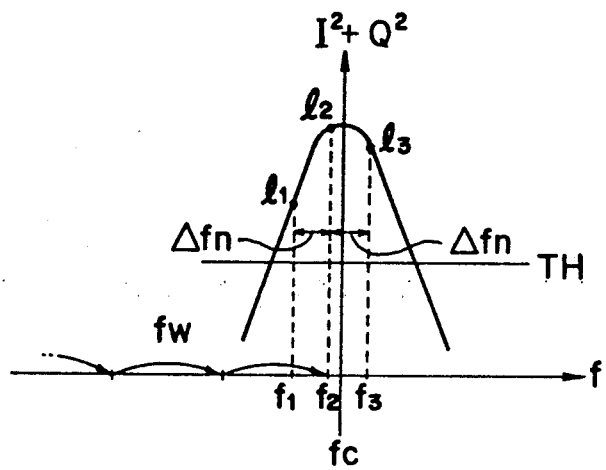
FIGS. 4A, 4B, and 4C are views depicting how the first embodiment works.
Figure 4B:
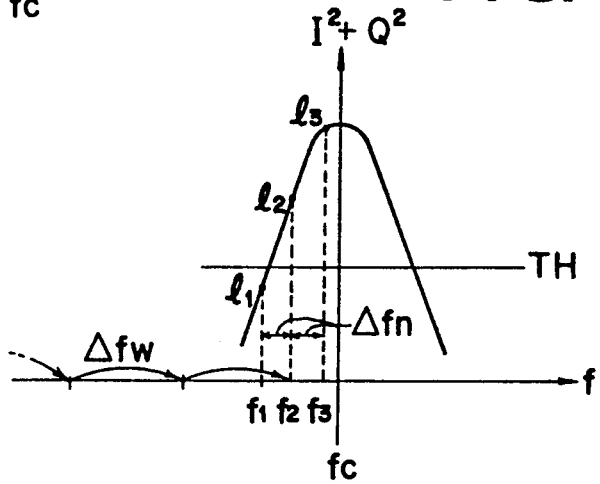
Figure 4C:
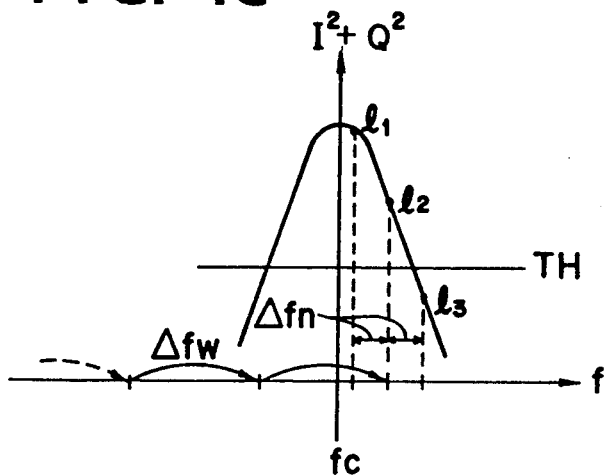

After the oscillation frequency "f" of the VCO 8 is successively raised in increments of $\Delta f_w$ and, as illustrated in FIGS. 4A, 4B and 4C, the demodulation intensity exceeds the threshold value TH at a given frequency $f_2$, the control circuit 11 detects the inequality in step S3. Thereafter, in step S5, the frequency increment unit of the VCO 8 is changed from $\Delta f_w$ to $\Delta f_n$, the latter coinciding with the PLL capture range.

As described, until the demodulation intensity reaches and exceeds a certain level (threshold value TH), the frequency of the VCO 8 is changed in increments of the frequency range $\Delta f_w$ which is wider than the PLL capture range $\Delta f_n$. This means the embodiment takes less time than the prior art demodulator to bring the oscillation frequency of the VCO 8 close to the receiving frequency of the satellite transmission. That is, the satellite transmission search time is shortened.

When the demodulation intensity reaches and exceeds the threshold value TH at a given frequency $f_2$, step S6 is reached where the following takes place: The control circuit 11 causes the oscillation frequency of the VCO 8 to fluctuate by $\pm \Delta f_n$ around the frequency $f_2$. The demodulation intensity calculating circuit 10 obtains demodulation intensity signals $l_1(f_1)$, $l_2(f_2)$ and $l_3(f_3)$ at three frequencies $f_1(=f_2-\Delta f_n)$, $f_2$ and $f_3$ ($=f_2+\Delta f_n$). In steps S7 and S8, as will be described later in more detail, the control circuit 11 detects which way the received satellite transmission is directed based on the inclination of the three demodulation intensity signals. With the direction of the transmission found out, the control circuit 11 changes the oscillation frequency of the VCO 8 in that direction. Eventually, PLL is locked in phase with the receiving frequency of the satellite transmission.

More specifically, in step S7, a check is made to see if the demodulation intensity signals at the three frequencies $f_1$, $f_2$ and $f_3$ fall into a relationship of $l_1<l_2>l_3$ as shown in FIG. 4A. When that relationship is attained, the center frequency $f_2$ is located at approximately the peak of the demodulation intensity curve M. Given that relationship, step S9 is reached in which PLL is ready to be locked in phase with the receiving frequency $f_c$ of the satellite transmission. So the control circuit 11 sets the oscillation frequency of the VCO 8 to $f_2$ and connects the switch 12 to the loop filter 7 at the same time. This constitutes a known PLL loop containing the loop filter 7 and the VCO 8. The VCO 8 is drawn to the receiving frequency $f_c$ of the satellite transmission and locked in phase. Thereafter, the VCO 8 reproduces the reference carrier exactly synchronized in phase with the receiving frequency $f_c$.

If the relationship of $l_1<l_2>l_3$ is not found to exist in step S7, step S8 is reached in which a check is made to see if $l_1<l_3$. If the relationship of $l_1<l_3$ is established in step S8, $f_2$ is judged to be on the frequency side lower than $f_c$, and step S10 is reached. In step S10, the control circuit 11 raises the frequency of the VCO 8 in increments of $\Delta f_n$ toward $f_c$. Every time a new range of $\Delta f_n$ is selected, the demodulation intensity thereof is obtained in step S11. In step S12, a check is made to see if the newly incremented frequency $f_2$ is lower than the preceding frequency $f_1$ in terms of demodulation intensity.

In step S12, if the current frequency $f_2$ is found to exceed the preceding frequency $f_1$ in demodulation intensity (i.e., $l_1<l_2$), the preceding frequency $f_1$ is judged to exist at the peak within $\pm \Delta f_n$ of the receiving frequency $f_c$ of the satellite transmission. In that case, step S9 is reached where the control circuit 11 sets the frequency of the VCO 8 to $f_1$ and connects the switch 12 to the loop filter 7. This constitutes a known PLL loop comprising the loop filter 7 and the VCO 8. The VCO 8 is then drawn to the receiving frequency $f_c$ of the satellite transmission and locked in phase. Thereafter, the VCO 8 reproduces the reference carrier exactly synchronized in phase with the receiving frequency $f_c$.

If the relationship of $l_1<l_3$ is not established in step S8, the frequency $f_2$ is judged to be higher than the frequency $f_c$ as depicted in FIG. 4C, and step S13 is reached. In step S13, the control circuit 11 lowers the frequency of VCO 8 in increments of $\Delta f_n$ toward $f_c$. Every time a new frequency is selected, the demodulation intensity thereof is obtained in step S14. In step S15, each new frequency $f_2$ after the $\Delta f_n$ reduction is compared with the preceding frequency $f_1$ in terms of demodulation intensity.

In step S15, if the current frequency $f_2$ is found to be higher than the preceding frequency $f_1$ in demodulation intensity (i.e., $l_1<l_2$), the preceding frequency $f_1$ is judged to exist at the peak within $\pm \Delta f_n$ of the receiving frequency $f_c$ of the satellite transmission, and step S9 is reached. In step S9, the control circuit 11 sets the frequency of the VCO 8 to $f_1$ and connects the switch 13 to the loop filter 7. This constitutes a known PLL loop comprising the loop filter 7 and the VCO 8. The VCO 8 is then drawn to the receiving frequency $f_c$ of the satellite transmission and locked in phase. Thereafter, the VCO 8 reproduces the reference carrier exactly synchronized in phase with the receiving frequency $f_c$.

In the above-described first embodiment, the position of the receiving frequency $f_c$ of the satellite transmission, i.e., the peak of the demodulation intensity curve M, is detected by comparing the current frequency with the preceding frequency in terms of demodulation intensity while the oscillation frequency of the VCO 8 is consecutively changed in units of the capture range $\Delta f_n$. However, this setup is not limitative of the present invention and any other alternative way of achieving the same effect may be used.

For example, after the demodulation intensity has reached the frequency $f_2$ exceeding the threshold value TH, the frequency of the VCO 8 may be changed consecutively in increments of $\Delta f_n$ throughout the entire frequency range of the demodulation intensity curve M in excess of the threshold value TH. The frequency of the highest intensity may be selected from among the successively selected frequencies, the selected frequency being considered to be the peak. If the search start frequency $f_s$ is always started from the lowest (or highest) frequency position within the satellite transmission search range so that the oscillation frequency of the VCO always approaches the receiving frequency $f_c$ of the satellite transmission from the low (or high) frequency side, the peak of the demodulation intensity curve always exists to the right-hand (or left-hand) side of the current position. This eliminates the need for the above-described capability to detect the direction of the peak.

Figure 2:
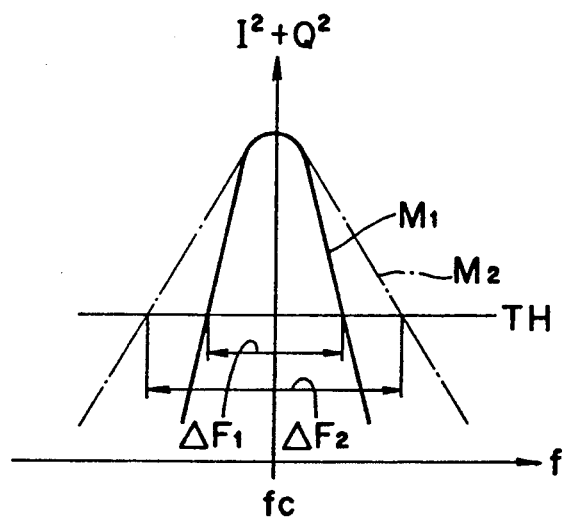
FIG. 2 is a view showing two demodulation intensity curves, one a wide band type and the other a narrow band type, for use with the method.
Figure 6:
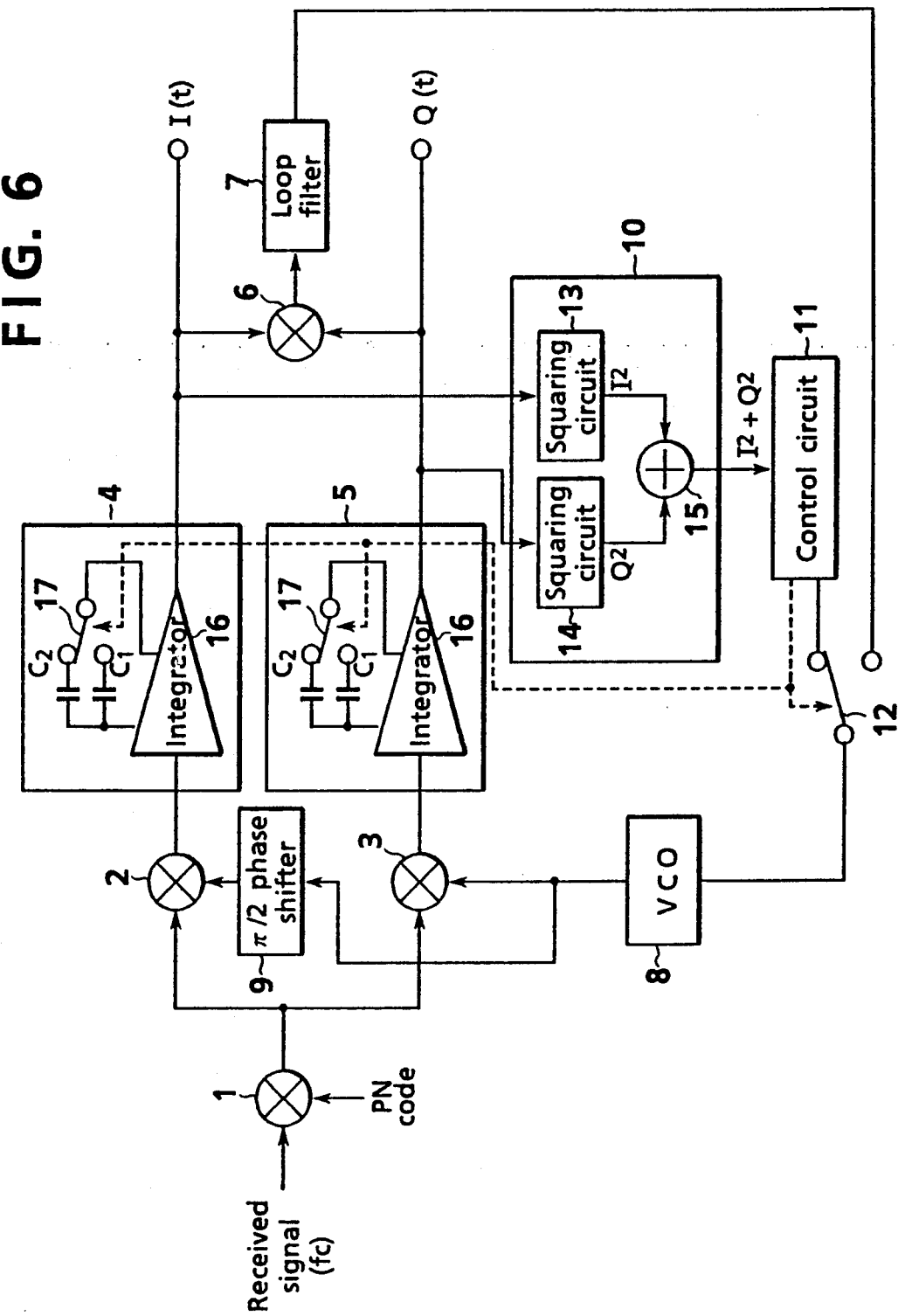
FIG. 6 is a block diagram of a second embodiment of the demodulator operating on the method according to the invention.
Figure 7:
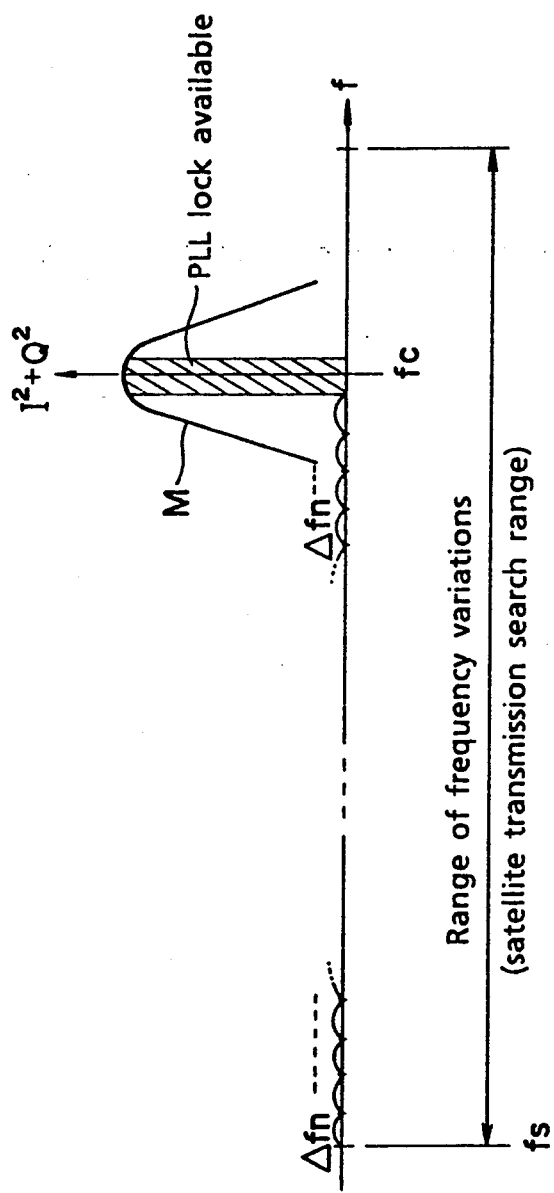
FIG. 7 is a view illustrating the operating principle of the typical prior art satellite transmission capturing method.

FIG. 6 illustrates a second embodiment of the demodulator operating on the method according to the invention. The second embodiment is the same as the first in terms of basic construction and operation. What makes the second embodiment differ from the first is as follows: The control circuit 11 operates a switch 17 in a way that allows electrostatic capacities $C_1$ and $C_2$ ($C_1 > C_2$) for the integral time constant of an integrator 16 to be switched as needed. That is, until the demodulation intensity $I^2 + Q^2$ of the demodulator exceeds the threshold value TH, the switch 17 is connected to the $C_2$ (lower-capacity) side so that the demodulation intensity curve of the demodulator is the wide band curve $M_2$ shown in FIG. 2. After the demodulation intensity $I^2 + Q^2$ has exceeded the threshold value TH, the switch 17 is connected to the $C_1$ (higher-capacity) side so that the demodulation intensity curve of the demodulator is the narrow band curve $M_1$ depicted in FIG. 2. This setup allows the band width of the demodulation intensity curve at the threshold value TH to be widened from $\Delta F_1$ to $\Delta F_2$. In the expanded range of $\Delta F_2$, the frequency range $\Delta f_w$ may be selected wider than ever before. This reduces the number of frequency changing steps to be changed, and the time required to capture the desired satellite transmission is further shortened.

The above-described embodiments have each of their circuits constituted by dedicated discrete circuit elements. Alternatively, all circuits except for the multipliers 1 through 3, the low pass filters 4 and 5 and the VCO 8 may be replaced by microcomputers that operate on suitable software.

As described and according to the invention, the PLL operation is stopped until the demodulation intensity of the demodulator reaches a predetermined level, and the frequency of the reproduced carrier of the demodulator is consecutively changed in increments of a frequency range wider than the PLL capture range in search for satellite transmissions. This makes it possible for the demodulation intensity to reach the predetermined level in fewer frequency changing steps than ever before. Accordingly, the time required to capture the desired satellite transmission is shortened.

Where the integral time constant of the low pass filter in the demodulator is set to a value smaller than that in effect during PLL operation until the demodulation intensity of the demodulator reaches the predetermined level, a wide band demodulation intensity curve is used in search for satellite transmissions until that level is exceeded. This further widens the frequency range in which to search satellite transmissions, and the time required to capture the desired satellite transmission is further shortened accordingly.

It is to be understood that while the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A satellite transmission capturing method for GPS receivers wherein a reference carrier is reproduced by a demodulator comprising a first multiplier for inverse diffusing said satellite transmission, a second multiplier for in-phase channel signal demodulation, a third multiplier for orthogonal channel signal demodulation, a first low-pass filter corresponding to said second multiplier, a second low-pass filter corresponding to said third multiplier, a fourth multiplier for detecting the phase difference of said satellite transmission and said reference carrier, a phase-locked loop (PLL) filter, a voltage controlled oscillator for generating said reference carrier, a demodulation intensity calculating circuit, a control circuit and a switch for switching to said PLL loop when said reference carrier is synchronized with said satellite transmission, said method comprising the steps of:

inverse diffusing said satellite transmission and applying the resulting received satellite transmission to said second and third multipliers;
generating the reference carrier;
demodulating said received satellite transmission by multiplying said received satellite transmission by an in-phase component of said reference carrier with said second multiplier and multiplying said received satellite transmission by an orthogonal component of the reference carrier with said third multiplier to obtain a demodulated in-phase channel signal I(t) and a demodulated orthogonal channel signal Q(t);
incrementing a frequency of said reference carrier within a predetermined Doppler-shift frequency range beginning at a starting frequency in frequency increments greater than a capture frequency range required for PLL operation to lock onto a captured transmission;
calculating a demodulation intensity based upon said in-phase channel signal I(t) and said orthogonal channel signal Q(t) corresponding to a particular frequency obtained following each frequency increment, said frequency increments being determined by a bandwidth corresponding to a predetermined threshold level of said demodulation intensity;
comparing said demodulation intensity obtained at each frequency increment to said threshold level;
reducing said frequency increments to correspond to said capture frequency range when said demodulation intensity of said particular frequency reaches said threshold level;
determining whether said particular frequency is located substantially at the peak of demodulation intensity corresponding to a received frequency of said received satellite transmission; and
initiating said PLL operation when said particular frequency is located substantially at the peak of demodulation intensity corresponding to said received frequency of said received satellite transmission to phase synchronize said reference carrier with said received frequency.

2. The satellite transmission capturing method according to claim 1, wherein said particular frequency is determined to be located substantially at the peak of demodulation when said particular frequency lies between the frequency range defined by frequencies resulting from the subtraction and addition of a frequency increment corresponding to said PLL capture range with said particular frequency.

3. A satellite transmission capturing method for GPS receivers according to claim 3, whereby the integral time constant of said first and second low pass filters in said demodulator is switched to a value lower than that in effect during PLL operation until the demodulation intensity of said demodulator reaches said threshold level.

* * * * *